(12) United States Patent
Ichida et al.

(10) Patent No.: US 7,973,340 B2
(45) Date of Patent: Jul. 5, 2011

(54) SEMICONDUCTOR INTEGRATED CIRCUIT WITH IMPROVED POWER SUPPLY SYSTEM

(75) Inventors: Makoto Ichida, Yokohama (JP); Masanori Wada, Yokohama (JP); Kazuma Tashiro, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 700 days.

(21) Appl. No.: 11/564,635

(22) Filed: Nov. 29, 2006

(65) Prior Publication Data
US 2007/0120257 A1    May 31, 2007

(30) Foreign Application Priority Data
Nov. 30, 2005   (JP) .................................. 2005-347168

(51) Int. Cl.
*H01L 27/10* (2006.01)
*H01L 23/48* (2006.01)
(52) U.S. Cl. ................... 257/207; 257/691; 257/758
(58) Field of Classification Search .................. 257/207, 257/691, 758
See application file for complete search history.

(56) References Cited

U.S. PATENT DOCUMENTS
5,075,753 A    12/1991   Kozono
6,969,952 B2 *  11/2005  Gedamu et al. .................. 315/94

FOREIGN PATENT DOCUMENTS
JP    2000-11011     1/2000
JP    2000-068383    3/2002
JP    2005-317580   11/2005

OTHER PUBLICATIONS

Japanese Office Action (with translation) issued on Mar. 8, 2011, in counterpart Japanese Patent Application No. 2005-347168 (5 pages).

* cited by examiner

*Primary Examiner* — Ori Nadav
(74) *Attorney, Agent, or Firm* — Oblon, Spivak, McClelland, Maier & Neustadt, L.L.P.

(57) ABSTRACT

Cells are formed on a substrate. First and second cell power wiring lines extend in a first direction on the substrate. First and second intermediate layer power wiring lines are formed on the first and second cell power lines. First upper layer power wiring lines are formed on the first and second intermediate layer power lines. The first upper layer power wiring lines extend in a second direction crossing the first direction at right angles. First contact members are formed between the first cell power lines and the first upper layer power lines. Second contact members are formed between the second cell power lines and the first upper layer power lines. The second contact members are arranged at positions shifted from a straight line which passes through the first contact members in the first direction and a straight line which passes through the first contact members in the second direction.

7 Claims, 6 Drawing Sheets

SEMICONDUCTOR INTEGRATED CIRCUIT WITH IMPROVED POWER SUPPLY SYSTEM

CROSS-REFERENCE TO RELATED APPLICATIONS

This application is based upon and claims the benefit of priority from prior Japanese Patent Application No. 2005-347168, filed Nov. 30, 2005, the entire contents of which are incorporated herein by reference.

BACKGROUND OF THE INVENTION

1. Field of the Invention

The present invention relates to a semiconductor integrated circuit, and more particularly, it relates to a power supply system for use in a semiconductor integrated circuit with large power consumption such as a system LSI.

2. Description of the Related Art

In recent years, in semiconductor integrated circuits such as system LSIs, high integration of transistors has progressed, and voltage drop caused by resistance of power wiring lines formed in the state of multiple layers is no longer negligible. In such semiconductor integrated circuits, a power is supplied from power wiring lines in an upper layer connected to power pins to power wiring lines (hereinafter referred to as "the cell power wiring lines") for functional cells (e.g., an AND gate and an OR gate) for realizing a predetermined electric function formed in lower layers. Here, in the power supply system, the power wiring lines are formed in the state of multiple layers and in a grid state, and a grid-like power voltage structure for supplying a power is used (e.g., see Jpn. Pat. Appln. KOKAI Publication No. 2000-11011).

In the system that the power is supplied from the upper layer power wiring lines to the cell power wiring lines via the plural grid-like power wiring lines described above, the power wiring lines having large widths can be used in the upper layer, but the power wiring lines having small widths can only be used for the lower layers as they go down. In consequence, there arises a problem that voltage drop by the power wiring lines becomes larger. To prevent this problem, spaces between the power wiring lines formed in the lower layers must be decreased to increase the power wiring lines. In the lower layers, however, the same wiring line layers are used for the power wiring lines and ordinary wiring lines. Therefore, when the spaces between the power wiring lines are decreased to increase the power wiring lines, there is a problem that regions available for the ordinary wiring lines decrease.

BRIEF SUMMARY OF THE INVENTION

A first aspect of the present invention is directed to a semiconductor integrated circuit comprising cells which are formed on a semiconductor substrate and which realize a predetermined electric function; first and second cell power wiring lines which extend in a first direction on the semiconductor substrate and which supply a power to the cells; first and second intermediate layer power wiring lines which are formed on the first and second cell power wiring lines and to which the power is supplied; first upper layer power wiring lines which are formed on the first and second intermediate layer power wiring lines and which extends in a second direction crossing the first direction at right angles and to which the power is supplied from the outside; first contact members formed between the first cell power wiring lines and the first upper layer power wiring lines via the first intermediate layer power wiring lines; and second contact members formed between the second cell power wiring lines and the first upper layer power wiring lines via the second intermediate layer power wiring lines, the second contact members being arranged at positions shifted from a straight line which passes through the first contact member in the first direction and a straight line which passes through the first contact member in the second direction.

A second aspect of the present invention is directed to a semiconductor integrated circuit comprising cells which are formed on a semiconductor substrate and which realize a predetermined electric function; first and second cell power wiring lines which extend in a first direction on the semiconductor substrate and which supply a power to the cells; first and second intermediate layer power wiring lines which are formed on the first and second cell power wiring lines and to which the power is supplied; first upper layer power wiring lines which are formed on the first and second intermediate layer power wiring lines and which extends in the first direction and to which the power is supplied from the outside; second upper layer power wiring lines which are formed on the first upper layer power wiring lines and which extends in a second direction crossing the first direction at right angles and to which the power is supplied from the outside; and a plurality of first contact members which are formed between the first upper layer power wiring lines and the second upper layer power wiring lines and which are arranged at certain intervals from one end to the other end in wiring line widths of the second upper layer power wiring lines on the first upper layer power wiring lines.

A third aspect of the present invention is directed to a semiconductor integrated circuit comprising cells which are formed on a semiconductor substrate and which realize a predetermined electric function; first and second cell power wiring lines which extend in a first direction on the semiconductor substrate and which are formed adjacent to each other and which supply a power to the cells; first and second intermediate layer power wiring lines which are formed on the first and second cell power wiring lines and to which the power is supplied; a plurality of upper layer power wiring lines which are formed on the first and second intermediate layer power wiring lines and which have an L-shape extending in the first direction and a second direction crossing the first direction at right angles and to which the power is supplied from the outside; first contact member formed between a first upper layer power wiring line included in the plurality of upper layer power wiring lines and the first cell power wiring lines via the first intermediate layer power wiring lines; and second contact member formed between a second upper layer power wiring line included in the plurality of upper layer power wiring lines and the second cell power wiring lines via the second intermediate layer power wiring lines, the second contact members being arranged at positions shifted from a straight line which passes through the first contact members in the first direction and a straight line which passes through the first contact members in the second direction, wherein the plurality of upper layer power wiring lines having the L-shape are arranged at predetermined intervals; and the wiring lines arranged from the center to one end of the semiconductor substrate are shifted from the wiring lines arranged from the center to the other end thereof as much as one wiring line in the second direction.

DETAILED DESCRIPTION OF THE INVENTION

Embodiments of the present invention will hereinafter be described with reference to the drawings. In the description, common parts in all the drawings are denoted with common reference numerals.

First Embodiment

First, a semiconductor integrated circuit according to a first embodiment of the present invention will be described.

Figure 1:
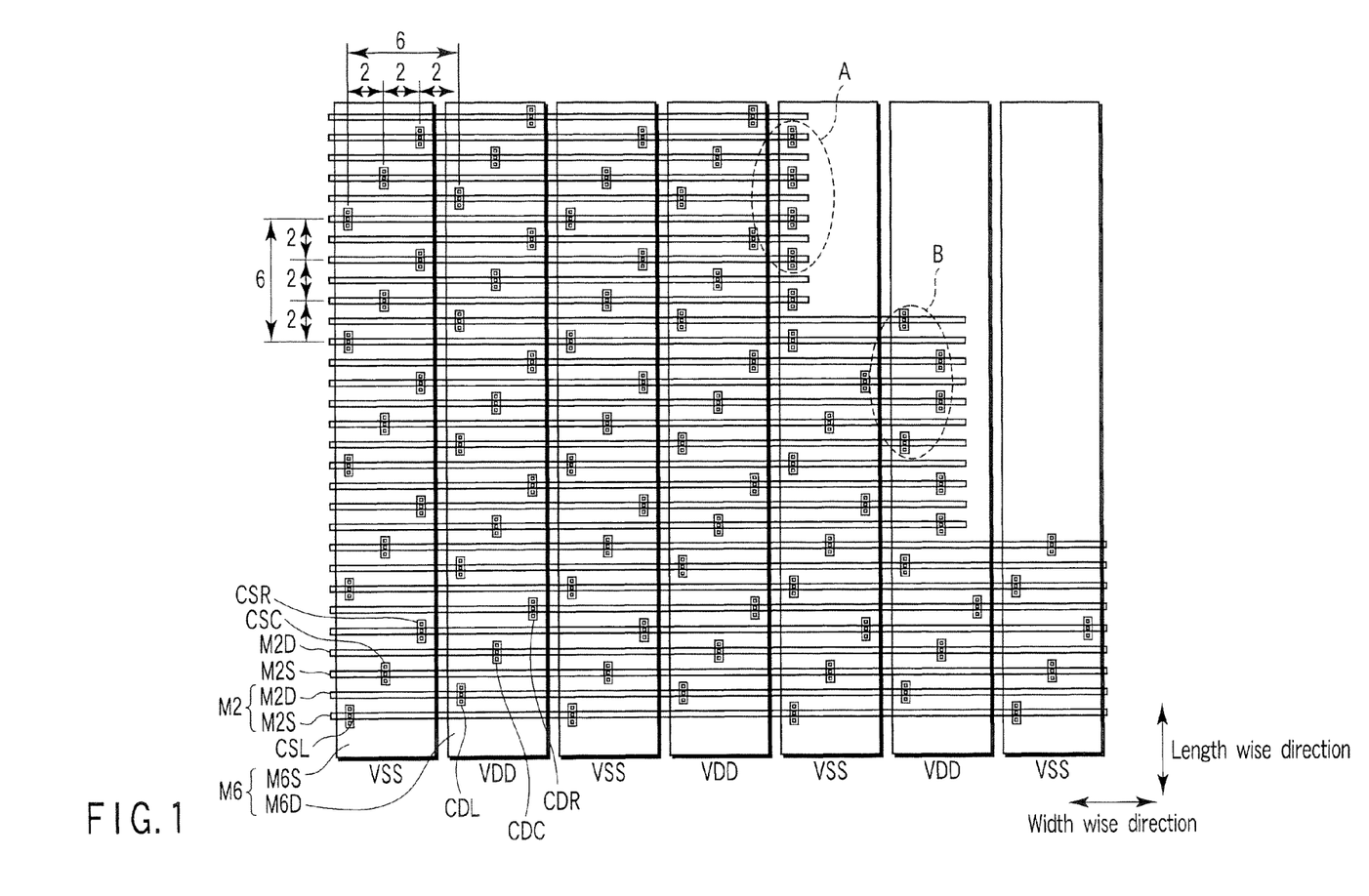
FIG. 1 is a layout diagram showing a constitution of a semiconductor integrated circuit of a first embodiment of the present invention.

FIG. 1 is a layout diagram showing a constitution of a semiconductor integrated circuit of the first embodiment.

In the uppermost layer of a semiconductor substrate, power wiring lines (hereinafter referred to as "the upper layer power wiring lines") M6 are formed. In intermediate layers under the upper power wiring lines M6, power wiring lines (hereinafter referred to as "the intermediate layer power wiring lines") M5, M4, M3 are formed in this order. Furthermore, in a cell layer which is formed under the intermediate layer power wiring lines M3 and in which function cells are formed, cell power wiring lines M2 are formed which supply the power to the function cells. The function cells are circuits for realizing a predetermined electric function. The upper layer power wiring lines M6 are connected to external power pins through which the power is input into the upper layer power wiring lines M6. To the intermediate layer power wiring lines M5, M4, M3 and the cell power wiring lines M2, the power is supplied from the upper layer power wiring lines M6 via columnar contact members.

Each of the upper layer power wiring lines M6 includes a reference voltage wiring line M6S to which a reference voltage (e.g., a ground voltage) Vss is supplied, and a power voltage wiring line M6D to which a power voltage VDD is supplied. The reference voltage wiring lines M6S and the power voltage wiring lines M6D linearly extend in a lengthwise direction (a second direction), and are alternately arranged in parallel at intervals.

Each of the cell power wiring lines M2 includes a reference voltage wiring line M2S to which the reference voltage Vss is supplied, and a power voltage wiring line M2D to which the power voltage VDD is supplied. The reference voltage wiring lines M2S and the power voltage wiring lines M2D linearly extend in a widthwise direction (a first direction) crossing the lengthwise direction at right angles, and are alternately arranged in parallel at intervals.

Furthermore, between the reference voltage wiring lines M6S and the reference voltage wiring lines M2S, columnar contact members CSL, CSC, CSR are formed which electrically connect these wiring lines. These contact members are shifted to the left, center and right in wiring line widths of the reference voltage wiring lines M6S, as shown in FIG. 1. More specifically, each pair of the first, second and third reference voltage wiring lines M2S is arranged so as to sandwich the power voltage wiring line M2D therebetween. In this case, the contact member CSL connecting each first reference voltage wiring line M2S to each reference voltage wiring line M6S is arranged at one end in the wiring line width of the reference voltage wiring line M6S. Moreover, the contact member CSC connecting each second reference voltage wiring line M2S to each reference voltage wiring line M6S is arranged at the center in the wiring line width of the reference voltage wiring line M6S, and the contact member CSR connecting each third reference voltage wiring line M2S and each reference voltage wiring line M6S is arranged at the other end in the wiring line width.

Similarly, between the power voltage wiring lines M6D and the power voltage wiring lines M2D, columnar contact members CDL, CDC and CDR are formed which electrically connect these wiring lines. These contact members are shifted to the left, center and right in wiring line widths of the reference voltage wiring lines M6D, as shown in FIG. 1. More specifically, each pair of the first, second and third power voltage wiring lines M2D is arranged so as to sandwich the reference voltage wiring line M2S therebetween. In this case, the contact member CDL connecting each first power voltage wiring line M2D to each power voltage wiring line M6D is arranged at one end in the wiring line width of the power voltage wiring line M6D. Moreover, the contact member CDC connecting each second power voltage wiring line M2D to each power voltage wiring line M6D is arranged at the center in the wiring line width of the power voltage wiring line M6D, and the contact member CDR connecting each third power voltage wiring line M2D and each power voltage wiring line M6D is arranged at the other end in the wiring line width.

The contact members CSL, CSC and CSR are arranged in accordance with the following predetermined rule. As shown in FIG. 1, three contact members CSL, CSC and CSR are arranged between an interval 6 in the longitudinal and transverse directions. An interval between the contact members CSL and CSC is 2, and an interval between the contact members CSC and CSR is 2. When the contact members CSL, CSC and CSR are arranged at such intervals, ordinary wiring lines formed in the longitudinal and traverse directions can be efficiently arranged. The contact members CDL, CDC and CDR are also arranged in accordance with the above-mentioned rule in the same manner.

In the first embodiment, the contact members CSL, CSC and CSR, or CDL, CDC and CDR are not arranged on a straight line in the longitudinal direction but they are shifted, and therefor it is possible to efficiently supply a power to the lower layer wiring lines without damaging formation regions of the ordinary wiring lines in the lower layers including a cell layer where functional cells are formed. For example, when the contact members are arranged on the straight line in the longitudinal direction, the contact members become walls, and hence regions for allowing the passage of the ordinary wiring lines are remarkably limited. In the first embodiment, it is possible to reduce such limitation.

In addition, in each region where the upper layer power wiring line M6 and the cell power wiring line M2 completely overlap, the columnar contact members may be arranged, with they being shifted, as described above. However, in some regions, the upper layer power wiring line M6 and the cell power wiring line M2 do not completely overlap. In such regions, if there is a region where the upper layer power wiring line M6 and the cell power wiring line M2 overlap, the contact members are arranged in the overlap region, whereby the sufficient power can be supplied to the cell power wiring line M2. For example, the right ends of the cell power wiring lines M2 are different from the center portions of the cell power wiring lines M2 in formation positions of the columnar contact members, as shown by regions A and B.

In the region where the upper layer power wiring line M6 and the cell power wiring line M2 do not completely overlap, if the contact members are shifted in the same manner as in the region where the upper layer power wiring line M6 and the cell power wiring line M2 completely overlap, the contact members are out of the region and hence they cannot be arranged on the cell power wiring line M2. In such a case, the contact member is arranged in the region where the upper layer power wiring line M6 and the cell power wiring line M2 overlap.

Figure 2:
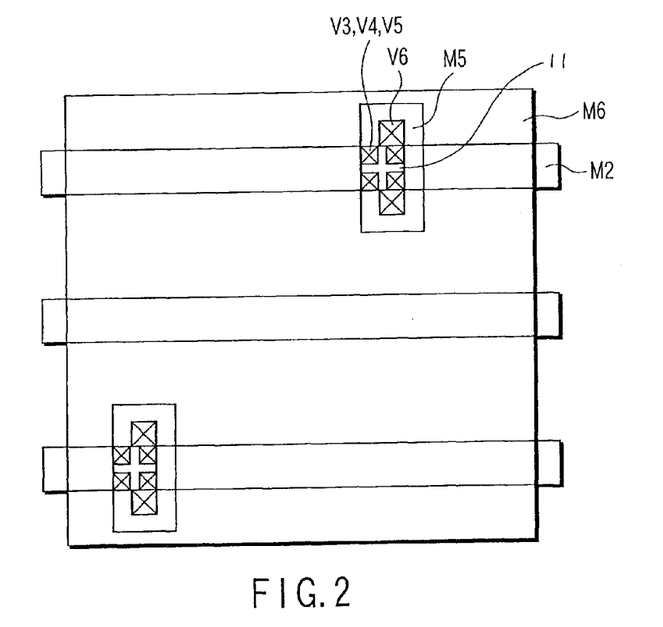
FIG. 2 is a layout diagram showing enlarged contact members in the semiconductor integrated circuit of the first embodiment.
Figure 3:
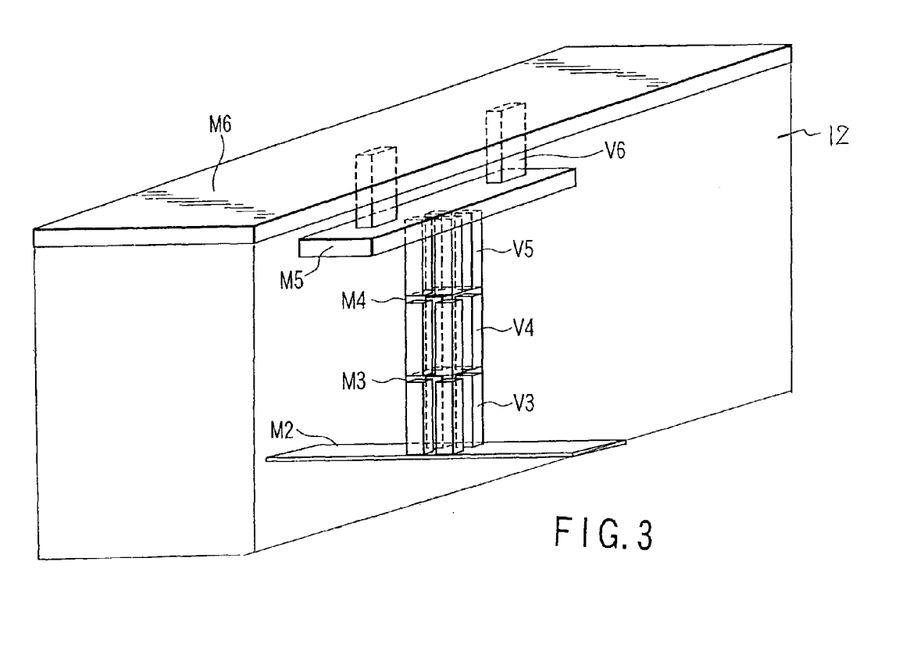
FIG. 3 is a perspective view showing a structure of the contact member shown in FIG. 2.

FIG. 2 is a layout diagram in which the portion of the contact member in FIG. 1 is enlarged. FIG. 3 is a perspective view showing a structure of the contact member portion.

As shown in FIGS. 2 and 3, a contact member V3 is formed on the cell power wiring line M2 so that the contact member V3 is just received in a wiring line width of the cell power wiring line M2. On the contact member V3, the intermediate layer power wiring line M3 is formed which has a wiring line width equal to that of the cell power wiring line M2. Furthermore, on the intermediate layer power wiring line M3, there are formed a contact member V4, the intermediate layer power wiring line M4 and a contact member V5 in this order to constitute a columnar contact member. Each of the contact members V3, V4 and V5 is constituted of four columnar contact plugs which sandwich insulating layers 11 therebetween. On the contact member V5, the intermediate layer power wiring line M5 is formed, and on the intermediate layer power wiring line M5, contact members V6 are formed. In addition, on the contact members V6, the upper layer power wiring line M6 is formed. The contact members V6 which connect the intermediate layer power wiring line M5 to the upper layer power wiring line M6 are different in a design rule from lower layers below the intermediate layer power wiring line M5. Therefore, the number of the contact plugs for each contact member V6 is changed, and each contact member is constituted of two contact plugs.

Moreover, interlayer insulating films 12 are arranged around the contact members V3, V4, V5 and V6, respectively, and the contact members V3, V4, V5 and V6 are formed so as to be buried in the interlayer insulating films 12.

In the first embodiment, between the upper layer power wiring lines and the cell power wiring lines of the lower layers, the contact members are formed which electrically connect these wiring lines to each other, so that a power source voltage is supplied from the upper layer power wiring lines to the cell power wiring lines. In consequence, any power does not have to pass through the intermediate layer power wiring lines which exist between the upper layer power wiring lines and the cell power wiring lines and which is constituted of thin wiring lines. Therefore, a voltage drop of the power source can be suppressed. Moreover, the columnar contact members are not linearly arranged but they are arranged so that the contact members are shifted from one another little by little, so that it is possible to prevent the contact members from obstructing the formation of ordinary wiring lines.

Furthermore, each of the contact members CSL, CSC and CSR, and the contact members CDL, CDC and CDR is constituted of four columnar contact plugs. Since each contact member is constituted of four columnar contact plugs in this manner, for example, even when one contact plug breaks, the other contact plugs can keep electrical connection. As a result, reliabilities of the contact members CSL, CSC and CSR, and the contact members CDL, CDC and CDR can be improved.

Second Embodiment

Next, there will be described a semiconductor integrated circuit of a second embodiment according to the present invention. The same constitutional portions as in the first embodiment are denoted with the same reference numerals.

Figure 4:
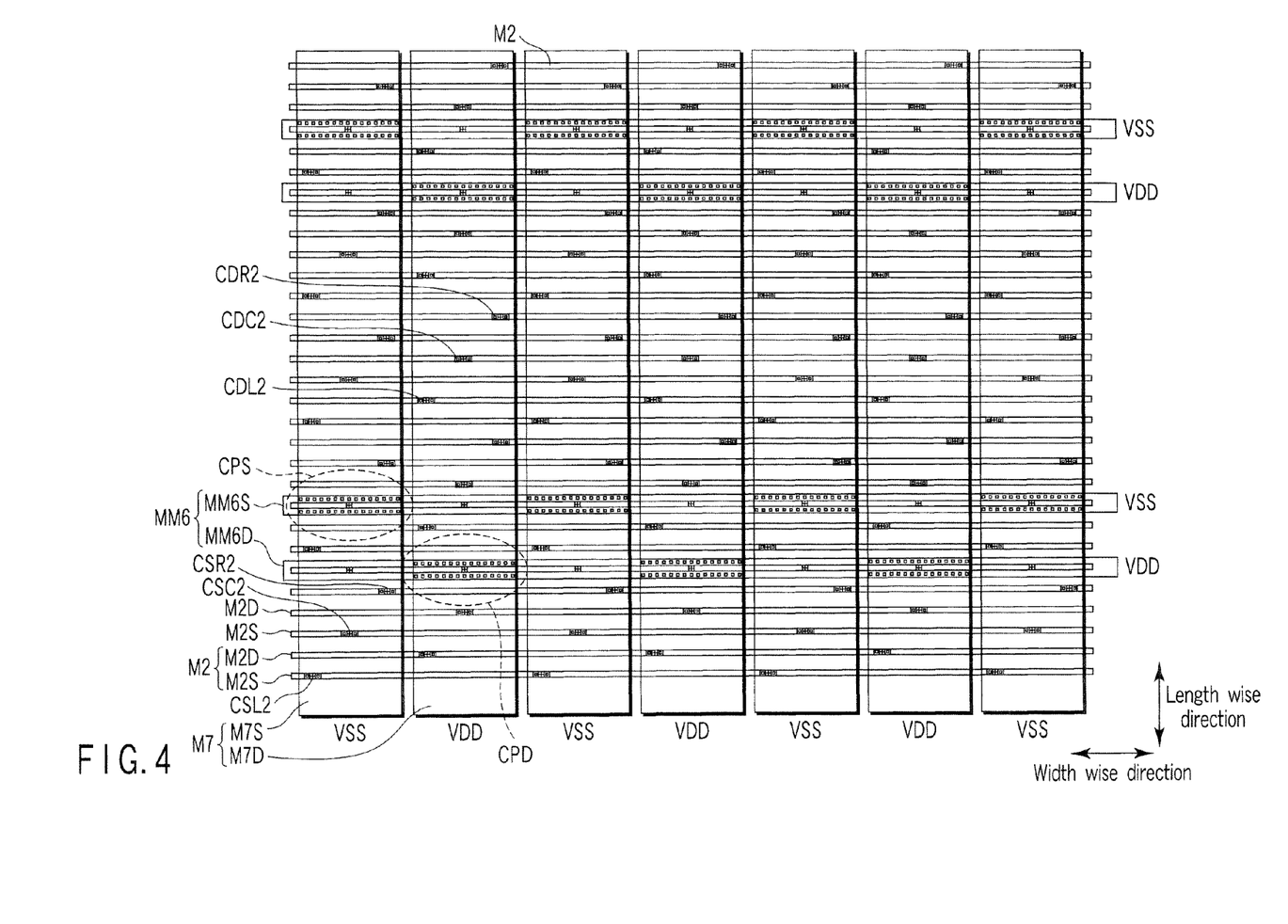
FIG. 4 is a layout diagram showing a constitution of a semiconductor integrated circuit of a second embodiment of the present invention.

FIG. 4 is a layout diagram showing a constitution of the semiconductor integrated circuit of the second embodiment.

The second embodiment has a constitution in which power wiring lines of upper layers are reinforced to efficiently supply a power to cell power wiring lines M2.

Upper layer power wiring lines M7 are formed in an uppermost layer of a semiconductor substrate. Under the upper layer power wiring lines M7, upper layer power wiring lines MM6 are formed. In intermediate layers under the upper layer power wiring lines MM6, intermediate layer power wiring lines M5, M4 and M3 are formed in this order. Furthermore, in a cell layer arranged under the intermediate layer power wiring lines M3 and provided with functional cells, there are formed cell power wiring lines M2 which supply the power to the functional cells. The upper layer power wiring lines M7, MM6 are connected to external power source pins, and into the upper layer power wiring lines M7, MM6, the power is input from the outside. The upper layer power wiring lines M7 are electrically connected to the wiring lines MM6 via contact members. To the intermediate layer power wiring lines M5, M4 and M3 and the cell power wiring lines M2, the power is supplied from the upper layer power wiring lines M7 and MM6 via columnar contact members.

Each of the upper layer power wiring lines M7 has a reference voltage wiring line M7S to which a reference voltage Vss is supplied, and a power voltage wiring line M7D to which a power source voltage VDD is supplied. The reference voltage wiring lines M7S and the power voltage wiring lines M7D linearly extend in a lengthwise direction, respectively, and are alternately arranged in parallel at intervals. Each of the upper layer power wiring lines MM6 has a reference voltage wiring line MM6S to which the reference voltage Vss is supplied, and a power voltage wiring line MM6D to which the power source voltage VDD is supplied. The reference voltage wiring lines MM6S and the power voltage wiring lines MM6D linearly extend in a widthwise direction crossing the lengthwise direction at right angles, and are alternately arranged in parallel at intervals. Furthermore, each of the cell power wiring lines M2 has a reference voltage wiring line M2S to which the reference voltage Vss is supplied, and a power voltage wiring line M2D to which the power source voltage VDD is supplied. The reference voltage wiring lines M2S and the power voltage wiring lines M2D linearly extend in the widthwise direction crossing the lengthwise direction at right angles, and are alternately arranged in parallel at intervals.

Moreover, in each region where the reference voltage wiring line M7S, the reference voltage wiring line MM6S and the reference voltage wiring line M2S overlap, a reinforced contact member CPS is formed which electrically connects these lines to one another. A structure of the contact member CPS will be described later in detail. Furthermore, between the reference voltage wiring lines M7S and the reference voltage wiring lines M2S, columnar contact members CSL2, CSC2 and CSR2 are formed which electrically connect these lines to each other and which are not reinforced. As shown in FIG. 4, these contact members are shifted to the left, center and right in wiring line widths of the reference voltage wiring lines M7S. More specifically, each pair of the first, second and third reference voltage wiring lines M2S is arranged so as to sandwich the power voltage wiring line M2D therebetween. Moreover, the contact member CSL2 which connects each first reference voltage wiring lines M2S to each reference voltage wiring lines M7S is arranged at one end in a wiring line width of the reference voltage wiring line M7S. Furthermore, the contact member CSC2 which connects each second reference voltage wiring line M2S to each reference voltage wiring line M7S is arranged at the center in the wiring line width of the reference voltage wiring line M7S, and the contact member CSR2 which connects each third reference voltage wiring line M2S to each reference voltage wiring line M7S is arranged at the other end in the wiring line width.

In each region where the power voltage wiring line M7D, the power voltage wiring line MM6D and the power voltage wiring line M2D overlap, a reinforced contact member CPD is formed which electrically connects these lines to one another. A structure of the contact member CPD will be described layer in detail. Furthermore, between the power voltage wiring lines M7D and the power voltage wiring lines M2D, columnar contact members CDL2, CDC2 and CDR2 are formed which electrically connect these wiring lines to each other and which are not reinforced. These contact members are shifted to the left, center and right in wiring line widths of the reference voltage wiring lines M7D, as shown in FIG. 4. More specifically, each pair of the first, second and third power voltage wiring lines M2D is arranged so as to sandwich the reference voltage wiring line M2S therebetween. In this case, the contact member CDL2 connecting each first power voltage wiring line M2D to each power voltage wiring line M7D is arranged at one end in the wiring line width of the power voltage wiring line M7D. Moreover, the contact member CDC2 connecting each second power voltage wiring line M2D to each power voltage wiring line M7D is arranged at the center in the wiring line width of the power voltage wiring line M7D, and the contact member CDR2 connecting each third power voltage wiring line M2D and each power voltage wiring line M7D is arranged at the other end in the wiring line width.

In the second embodiment, in addition to the upper layer power wiring lines M7 of the uppermost layer formed in the lengthwise direction, the upper layer power wiring lines MM6 formed in the widthwise direction crossing the lengthwise direction at right angles are used to supply the power from the outside. In consequence, the connection between the power wiring lines M7 and MM6 can be reinforced, so that the power can efficiently be supplied from the upper layer power wiring lines M7 to the cell power wiring lines M2.

Figure 5:
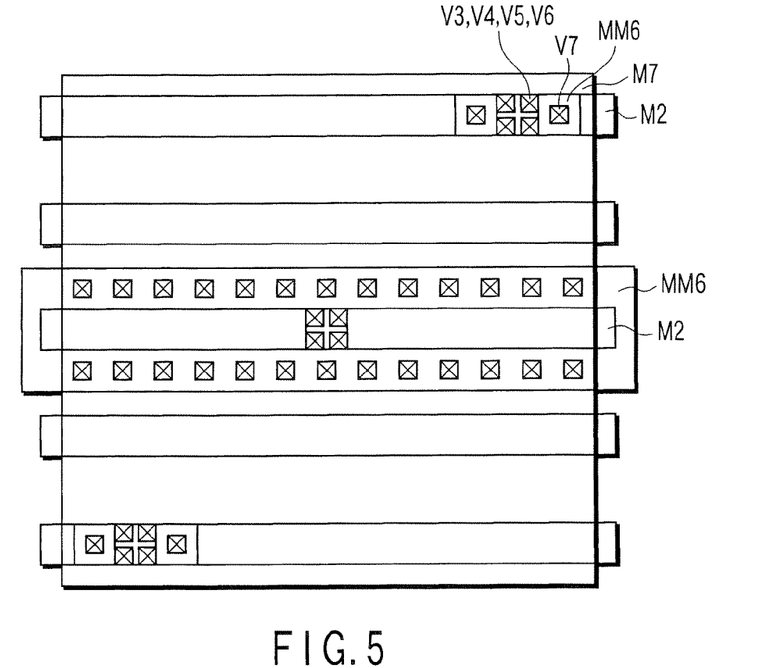
FIG. 5 is a layout diagram showing enlarged contact members in the semiconductor integrated circuit of the second embodiment.
Figure 6:
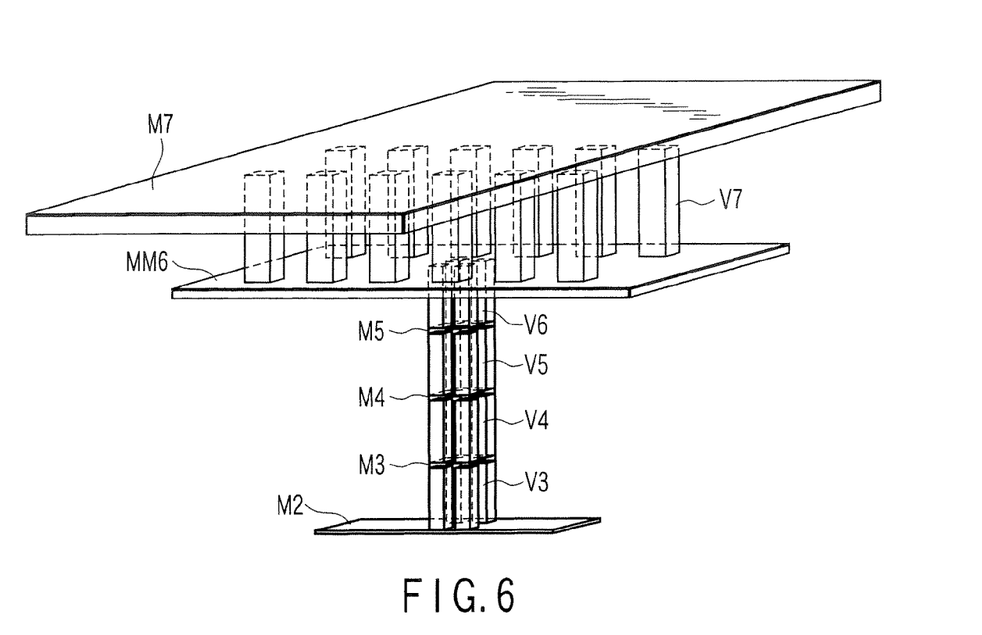
FIG. 6 is a perspective view showing a structure of the reinforced contact member shown in FIG. 5.
Figure 7:
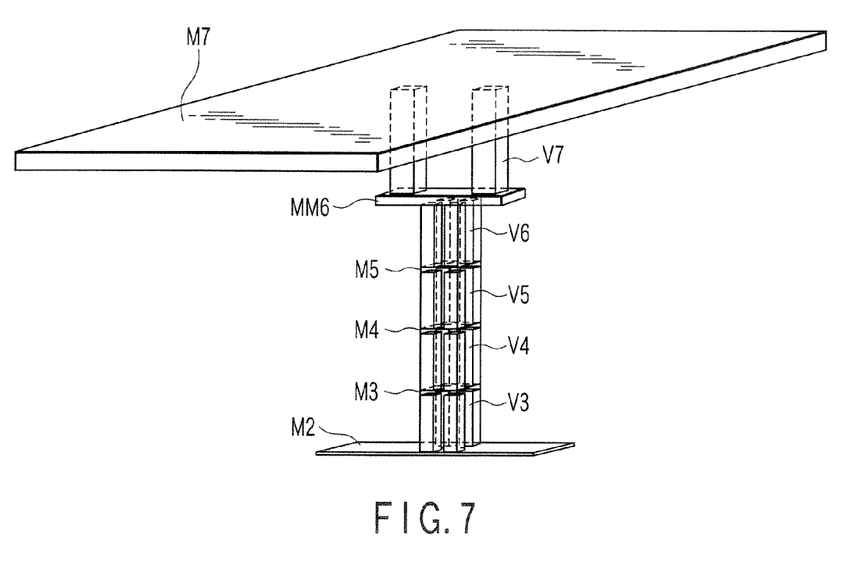
FIG. 7 is a perspective view showing a structure of the unreinforced contact member shown in FIG. 5.

FIG. 5 is a layout diagram in which contact members in FIG. 4 are enlarged. FIG. 6 is a perspective view showing a structure of the reinforced contact members, and FIG. 7 is a perspective view showing a structure of the contact member which is not reinforced.

First, the reinforced contact members CPS, CPD have the following structure. As shown in FIGS. 5 and 6, a contact member V3 is formed on the cell power wiring line M2 so that the contact member V3 is just received in a wiring line width of the cell power wiring line M2. On the contact member V3, the intermediate layer power wiring line M3 is formed which has a wiring line width equal to that of the cell power wiring line M2. Furthermore, on the intermediate layer power wiring line M3, there are formed a contact member V4, the intermediate layer power wiring line M4, a contact member V5, the intermediate layer power wiring line M5 and a contact member V6 in this order to constitute a columnar contact member. Each of the contact members V3, V4, V5 and V6 is constituted of four columnar contact plugs which sandwich insulating layers therebetween.

The intermediate layer power wiring line MM6 is formed on the contact member V6, and contact members V7 are formed on the intermediate layer power wiring line MM6. In addition, the upper layer power wiring line M7 is formed on the contact members V7. The contact members V7 which connect the upper layer power wiring line MM6 to the upper layer power wiring line M7 are different in a design rule from lower layers below the upper layer power wiring line MM6. Therefore, the number of the contact plugs for each contact member V6 is changed, and the contact member is constituted of a plurality of contact plugs arranged in an extending direction of the upper layer power wiring line MM6.

Interlayer insulating films (not shown) are arranged around the contact members V3, V4, V5, V6 and V7, respectively, and the contact members V3, V4, V5, V6 and V7 are formed so as to be buried in the interlayer insulating films.

Moreover, the contact members CSL2, CSC2 and CSR2, and the contact members CDL2, CDC2 and CDR2 which are not reinforced have the following structure. As shown in FIGS. 5 and 7, the contact member V3 is formed on the cell power wiring line M2 so that the contact member V3 is just received in a wiring line width of the cell power wiring line M2. On the contact member V3, the intermediate layer power wiring line M3 is formed which has a wiring line width equal to that of the cell power wiring line M2. Furthermore, on the intermediate layer power wiring line M3, there are formed the contact member V4, the intermediate layer power wiring line M4, the contact member V5, intermediate layer power wiring line M5 and the contact member V6 in this order to thereby constitute a columnar contact member. Each of the contact members V3, V4, V5 and V6 is constituted of four columnar contact plugs which sandwich insulating layers therebetween.

The upper layer power wiring line MM6 is formed on the contact member V6, and on the upper layer power wiring line MM6, the contact member V7 is formed. Furthermore, on the contact member V7, the upper layer power wiring line M7 is formed. The contact members V7 which connect the upper layer power wiring line MM6 to the upper layer power wiring line M7 are different in a design rule from lower layers below the upper layer power wiring line MM6. Therefore, the number of the contact plugs for each contact member V7 is changed, and the contact member is constituted of two contact plugs.

Interlayer insulating films (not shown) are arranged around the contact members V3, V4, V5, V6 and V7, respectively, and the contact members V3, V4, V5, V6 and V7 are formed so as to be buried in the interlayer insulating films.

In the second embodiment, between the upper layer power wiring lines and the cell power wiring lines of the lower layers, the contact members are formed which electrically connect these wiring lines to each other, and a power source voltage is supplied from the upper layer power wiring lines to the cell power wiring lines. In consequence, any power does not have to pass through the intermediate layer power wiring lines which exists between the upper layer power wiring lines and the cell power wiring lines and which is constituted of thin wiring lines. Therefore, a voltage drop of the power source can be suppressed. Moreover, the columnar contact members are not linearly arranged but they are arranged so that the contact members are shifted from one another little by little. Therefore, it is possible to prevent the formation of ordinary wiring lines from being obstructed by the contact members.

In the second embodiment, the upper layer power wiring lines MM6 formed in the widthwise direction crossing the lengthwise direction at right angles are used to supply the power from the outside, in addition to the upper layer power wiring lines M7 of the uppermost layer formed in the lengthwise direction. In consequence, the connection between the power wiring lines M7 and MM6 can be reinforced, so that the power can efficiently be supplied from the upper layer power wiring lines M7 to the cell power wiring lines M2. Moreover, a width of each reinforced upper layer power wiring line MM6 is larger than that of the upper layer power wiring line MM6 which is not reinforced, so that a wiring line resistance is decreased. The other constitutions and effects are the same as in the first embodiment.

Third Embodiment

Next, there will be described a semiconductor integrated circuit of a third embodiment of the present invention. The same constitutional portions as in the first embodiment are denoted with the same reference numerals.

Figure 8:
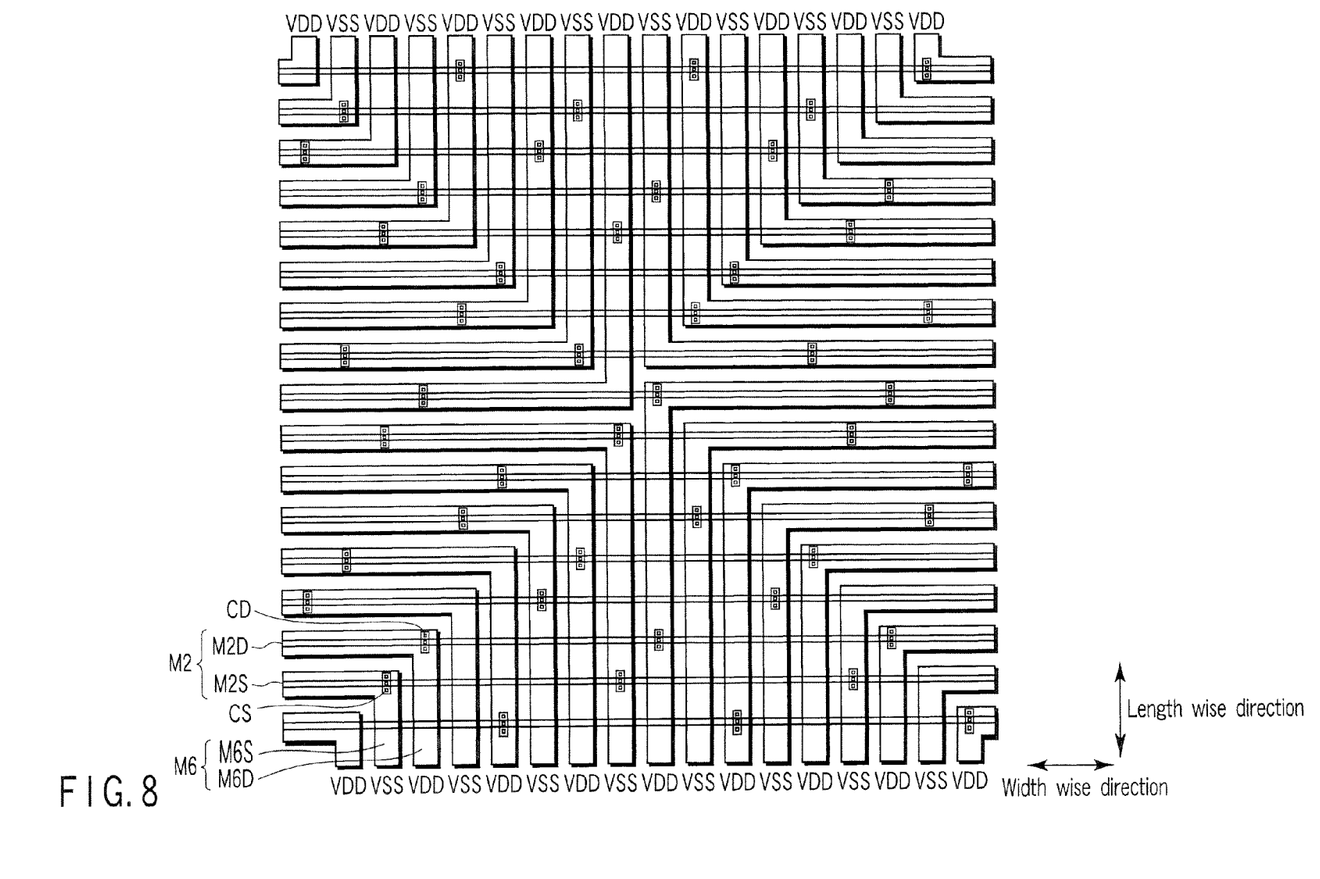
FIG. 8 is a layout diagram showing a constitution of a semiconductor integrated circuit of a third embodiment of the present invention.

FIG. 8 is a layout diagram showing a constitution of the semiconductor integrated circuit of the third embodiment.

The third embodiment has a constitution in which upper layer power wiring lines M6 of an uppermost layer are laid out into an L-shape. Reference voltage wiring lines M6S and power voltage wiring lines M6D constituting the upper layer power wiring lines M6 are laid out shifting the right half of the semiconductor integrated circuit as much as one stage so that the wiring lines M6S and M6D do not short-circuit owing to reference voltage wiring lines M2S or power voltage wiring lines M2D connected to these wiring lines. That is, the power voltage wiring lines M6D and the reference voltage wiring lines M6S in the right half of the semiconductor integrated circuit are laid out shifting these lines M6D and M6S in a lengthwise direction as much as one wiring line from the wiring lines in a widthwise direction in the power voltage wiring lines M6D and the reference voltage wiring lines M6S in the left half thereof.

Furthermore, between the reference voltage wiring lines M6S and the reference voltage wiring lines M2S, columnar contact members CS are formed which electrically connect these wiring lines to each other. Between the power voltage wiring lines M6D and the power voltage wiring lines M2D, columnar contact members CD are formed which electrically connect these wiring lines to each other. In this case, as the columnar contact members CS, CD, the same members as in FIG. 3 are used. The other constitutions are the same as in the first embodiment.

In the third embodiment, the reference voltage wiring lines M6S and the power voltage wiring lines M6D arranged in the right half of the semiconductor integrated circuit are laid out to shift as much as one stage, and hence short-circuit is prevented. Furthermore, the columnar contact members are shifted at a predetermined interval, it is possible to largely secure a region in which the ordinary wiring lines are formed.

According to the embodiments of the invention, there can be provided the semiconductor integrated circuit in which the voltage drop of the power source can be suppressed during power supply from the power wiring lines of the upper layer to the power wiring lines of the lower layer, and a decrease of the region of the lower layer for forming the ordinary wiring lines can be suppressed.

Moreover, the respective embodiments described above can be performed alone or in a suitable combination. Furthermore, the above embodiments include various stages of the invention, and it is possible to extract the inventions of various stages by a suitable combination of a plurality of constitutional requirements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
   cells which are formed on a semiconductor substrate and which realize a predetermined electric function;
   a first cell power wiring line which extends in a first direction on the semiconductor substrate and which supplies a power to the cells, the first cell power wiring line being arranged in a first plane;
   a second cell power wiring line which extends in the first direction on the semiconductor substrate and which supplies the power to the cells, the second cell power wiring line being arranged in the first plane;
   a first upper layer power wiring line which is formed over the first cell power wiring line and the second cell power wiring line and which extends in a second direction crossing the first direction at right angles and to which the power is supplied from the outside, the first upper layer power wiring line being arranged in a second plane parallel to the first plane, the first plane and the second plane extending in the first direction and the second direction;
   a first contact member arranged at a first position and formed between the first cell power wiring line and the first upper layer power wiring line;
   a second contact member formed between the second cell power wiring line and the first upper layer power wiring line, the second contact member being arranged at a second position which is shifted a first distance from the first position along a straight line which extends through the first cell power wiring line in the first direction and which is shifted a second distance from the first position along a straight line which passes through the first contact member in the second direction; and
   a third cell power wiring line which extends in the first direction on the semiconductor substrate and which supplies the power to the cells, the third cell power wiring line being arranged in the first plane and between the first cell power wiring line and second cell power wiring line,
   wherein a distance in the second direction between the first cell power wiring line and the third cell power wiring line is substantially equal to a distance in the second direction between the second cell power wiring line and the third cell power wiring line.

2. The semiconductor integrated circuit according to claim 1, further comprising:
   an interlayer insulating film formed between the first cell power wiring line and the second cell power wiring line, and the first upper layer power wiring line,
   wherein the first contact member and the second contact member are buried in the interlayer insulating film.

3. The semiconductor integrated circuit according to claim 1, wherein each of the first contact member and the second contact member includes a plurality of contact plugs separated from one another by an insulating layer.

4. The semiconductor integrated circuit according to claim 1, wherein each of the first contact member and the second contact member includes a plurality of contact plugs and an insulating layer arranged between the plurality of contact plugs.

5. The semiconductor integrated circuit according to claim 4, wherein the plurality of contact plugs are arranged so as to sandwich the insulating layer therebetween in a section parallel to the surface of the semiconductor substrate.

6. The semiconductor integrated circuit according to claim 1, wherein the first distance and the second distance are substantially equal.

7. The semiconductor integrated circuit according to claim 1, wherein the first contact member is in direct contact with the first upper layer power wiring line and extends in a third direction perpendicular to the first direction and the second direction, and the second contact member is in direct contact with the first upper layer power wiring line and extends in the third direction.

* * * * *